United States Patent [19]

Wildi et al.

[11] Patent Number: 4,661,838
[45] Date of Patent: Apr. 28, 1987

[54] HIGH VOLTAGE SEMICONDUCTOR DEVICES ELECTRICALLY ISOLATED FROM AN INTEGRATED CIRCUIT SUBSTRATE

[75] Inventors: Eric J. Wildi; James E. Kohl, both of Clifton Park, N.Y.

[73] Assignee: General Electric Company, Schenectady, N.Y.

[21] Appl. No.: 790,716

[22] Filed: Oct. 24, 1985

[51] Int. Cl.[4] .................. H01L 29/78; H01L 29/40; H01L 29/80; H01L 29/90

[52] U.S. Cl. .......................... 357/23.8; 357/53; 357/43; 357/22; 357/23.4; 351/23.1; 351/13

[58] Field of Search ............ 357/23.8, 53, 43, 22 G, 357/23.4, 23.1

[56] References Cited

U.S. PATENT DOCUMENTS

| | | | |
|---|---|---|---|
| 4,409,606 | 10/1983 | Wagenaar et al. | 357/13 |
| 4,422,089 | 12/1983 | Vaes et al. | 357/22 |
| 4,494,134 | 1/1985 | Wildi et al. | 357/43 |

FOREIGN PATENT DOCUMENTS 53-67368  6/1978  Japan ........................ 357/43

OTHER PUBLICATIONS

J. A. Appels et al., "High Voltage Thin Layer Devices (Resurf Devices)", Proceedings of the 1979 IEEE International Electron Device Meeting, pp. 238–241.

E. J. Wildi et al., "Modeling and Process Implementation of Implanted Resurf Type Devices", Proceedings of the 1982 IEEE International Electron Device Meeting, pp. 268–271.

*Primary Examiner*—Martin H. Edlow
*Assistant Examiner*—Robert Limanek
*Attorney, Agent, or Firm*—John R. Rafter; James C. Davis, Jr.; Marvin Snyder

[57] ABSTRACT

High voltage semiconductor devices include a drift layer region underlying a field gate electrode, the drift layer region having a selected charge density of lesser magnitude than the charge density of the remainder of the drift layer. This tailoring of the charge density of the drift layer region lowers the pinch-off voltage of a MOSFET inherent in the drift layer region. This lower pinch-off voltage decreases the potential of a device buried-layer when the device is in a reverse blocking mode of operation.

28 Claims, 6 Drawing Figures

HIGH VOLTAGE SEMICONDUCTOR DEVICES ELECTRICALLY ISOLATED FROM AN INTEGRATED CIRCUIT SUBSTRATE

CROSS-REFERENCE TO RELATED APPLICATION

The present application is related to commonly-assigned U.S. patent application Ser. No. 639,042 filed on Aug. 9, 1984, by M. S. Adler, the entirety of which is incorporated herein by reference.

BACKGROUND OF THE INVENTION

The present invention relates to high voltage semiconductor devices, and more particularly to such devices that are electrically isolated from an integrated circuit substrate as well as from each other.

The above-referenced Adler application discloses and claims a high voltage semiconductor device, described in detail below, that is capable of forward conducting a high voltage while maintaining electrical isolation from an integrated circuit substrate on which it is constructed. The Adler device includes a field gate electrode, referenced to a selected potential, which operates in combination with a buried layer to pinch off an inherent MOSFET when the device is in a reverse blocking mode of operation. This pinching off of the MOSFET functions to reduce the potential of the buried layer when the device is in this reverse blocking mode of operation, thereby inhibiting avalanche breakdown of certain reverse-biased, bipolar junctions.

The present inventors have discovered that, with appropriate biasing of the field gate electrode, in the reverse blocking mode of operation the buried layer in the Adler device rises to a potential of approximately 60 volts. It would be desirable to provide a high voltage semiconductor device of the same type as the Adler device but having a reduced pinch-off voltage of the inherent MOSFET. Such a device would provide all the benefits of the Adler device while offering greater reliability of operation over an increased lifespan.

SUMMARY OF THE INVENTION

Accordingly, it is a principle object of the present invention to provide a new and improved high voltage semiconductor device including an inherent MOSFET having a low pinch-off voltage, and hence which is not subject to the aforementioned problems and disadvantages.

Another object of the present invention is to provide a high voltage semiconductor device that may be incorporated into an integrated circuit using conventional semiconductor fabrication technology.

Briefly, in accordance with a preferred embodiment of the invention, a new and improved high voltage semiconductor device is provided having a tailored charge density in a portion of a drift region underlying a field gate electrode. By selectively tailoring the charge density of the the drift region portion underlying the field gate electrode, in relation to the charge density of the remainder of the drift region, the pinch-off voltage of an inherent MOSFET device is decreased. This decrease in the pinch-off voltage lowers the potential of a buried layer when the device is in a reverse blocking mode of operation. This lowered buried layer-potential decreases the stress on certain reverse-biased bipolar junctions, thereby increasing the lifespan of the device and decreasing the likelihood of avalanche breakdown of these bipolar junctions.

BRIEF DESCRIPTION OF THE DRAWINGS

The features of the invention deemed to be novel are defined in the appended claims. The invention itself, however, as to both organization and method of operation, together with further objects and advantages, will be better understood by reference to the following description considered in connection with the accompanying drawing figures, in which like reference numerals are carried forward and in which:

DETAILED DESCRIPTION OF THE INVENTION

Figure 1:
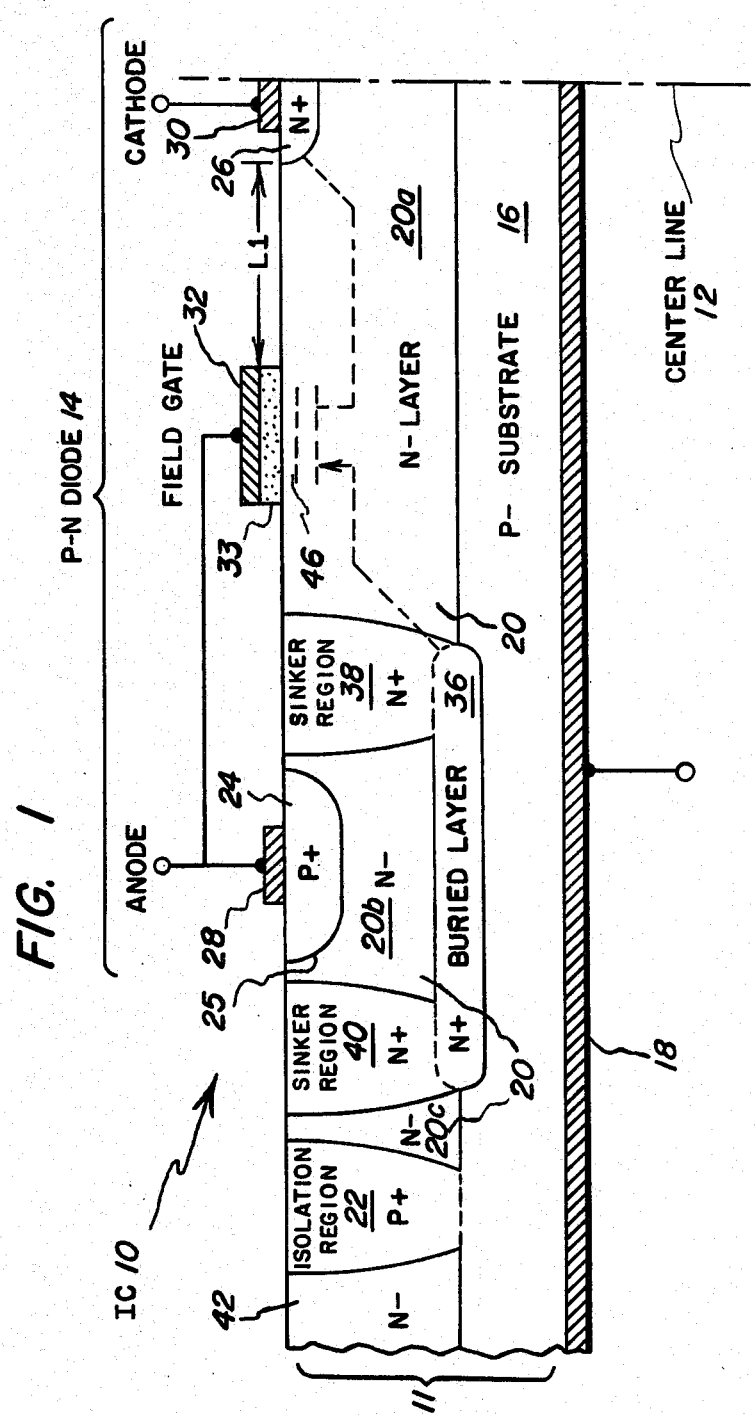
FIG. 1 is a cross-sectional schematic view of a high voltage semiconductor device incorporating a P-N diode and constructed in accordance with the above-referenced Adler application, the view being taken to the left of a center line.

Referring now to the drawings, FIG. 1 illustrates an integrated circuit (IC) 10 constructed in accordance with the above-referenced Adler application. IC 10 is implemented in a silicon semiconductor wafer 11, and is preferably symmetrical about a center line 12. IC 10 includes a laterally incorporated, high voltage P-N diode 14, rated, for example, at +500 volts.

Wafer 11 includes a P− (or low electrical conductivity, P-conductivity type) substrate layer 16, having, for example, a typical carrier concentration of $5 \times 10^{13}$ dopan atoms per cubic centimeter. A substrate electrode 18 adjoins the substrate layer 16 and is typically biased to a ground or reference potential. Atop P− substrate layer 16 is an N− (or low electrical conductivity, N-conductivity type) drift layer 20 approximately 5-10 microns in depth and having portions 20a, 20b and 20c. Drift layer 20 has a uniformly distributed charge density, Q1, typically on the order of $10^{12}$ dopant atoms per square centimeter. Adjoining P− substrate layer 16 is a P+ (or high conductivity, P-conductivity type) isolation region 22, configured as a loop surrounding P-N diode 14 so as to electrically isolate the diode from other devices (not shown) incorporated in IC 10.

P-N diode 14 includes a P+ anode region 24 extending into an upper portion of N− layer portion 20b and forming a junction 25 therewith, and an N+ (or high electrical conductivity, N-conductivity type) cathode portion 26 extending into an upper portion of N⁻ layer portion 20a. Anode region 24 is configured as a loop surrounding cathode region 26. Anode and cathode electrodes 28 and 30, respectively, adjoin anode and cathode regions 24 and 26, respectively.

Further included in P-N diode 14 is the combination of an N+ buried layer 36 and N+ sinker regions 38 and 40, which adjoins buried layer 36 so as to be at the same potential as the buried layer. N+ buried layer 36 is situated between P⁻ substrate layer 16 and N⁻ layer 20, beneath anode region 24, and is configured as a loop surrounding cathode region 26. N+ sinker region 38 extends from an upper surface 42 of N⁻ layer 20, through the N⁻ layer to buried layer 36, and is configured as a loop surrounding N+ cathode region 26. N+ sinker region 40 similarly extends from upper surface 42 to buried layer 36, and is configured as a loop surrounding P+ anode region 24. A field gate electrode 32 is insulatively spaced from surface 42 of N⁻ layer 20 by an insulating layer 33, and is electrically connected to anode electrode 28.

In operation, during forward conduction of P-N diode 14, both anode region 24 and cathode region 26 may be at high voltage (e.g., about +500 volts above the potential of substrate electrode 18), anode region 24 being slightly greater in potential than cathode region 26 (i.e., by the inherent potential of P-N junction 25 between the anode region and N⁻ layer portion 20b). In this mode of operation, field gate 32 does not exert a significant influence on N⁻ layer portion 20a, since the field gate is biased at substantially the same potential as N⁻ layer portion 20a.

The function of field gate electrode 32 becomes realized when P-N diode 14 is in a reverse blocking mode of operation and has a high reverse voltage across it. In a typical reverse blocking mode, for example, cathode region 26 may be at +500 volts, and anode region 24 may be at a low +50 volts. Field gate 32, biased as it is to the low potential of P+ anode region 24, is intended to prevent N+ buried layer 36 (and adjoining N+ sinker regions 38 and 40) from rising to a dangerously high voltage and causing an avalanche breakdown of bipolar junction 25. For an IC 10 with the above-specified, typical doping levels for substrate layer 16 and N⁻ layer 20, this avalanche breakdown would occur at approximately +50 to +100 volts, substantially below the desired +500 volts for P-N diode 14. Field gate 32 is intended to prevent this avalanche breakdown from occurring by pinching off an inherent MOSFET 46 (shown in dashed line) in N⁻ layer portion 20a. This "pinch-off" phenomenon results from the depletion region (not illustrated) induced in MOSFET 46 by field gate electrode 32, which is negatively biased with respect to N⁻ layer portion 20a, the depletion region extending vertically throughout the entire thickness of N⁻ layer portion 20a. The reverse voltage between cathode region 26 and N+ buried layer 36 is predominantly supported by the lateral extent of N⁻ layer portion 20a between field gate electrode 32 and the cathode region, over the distance indicated at L1.

It has been discovered by the present inventors, however, that in the reverse blocking mode of operation described above, buried layer 36 approaches a potential in the range of 50-60 volts before pinch-off of MOSFET 47 is achieved. This pinch-off voltage is sufficiently close to the avalanche breakdown voltage of P-N junction 25 to cause the eventual failure of diode 14.

Figure 2:
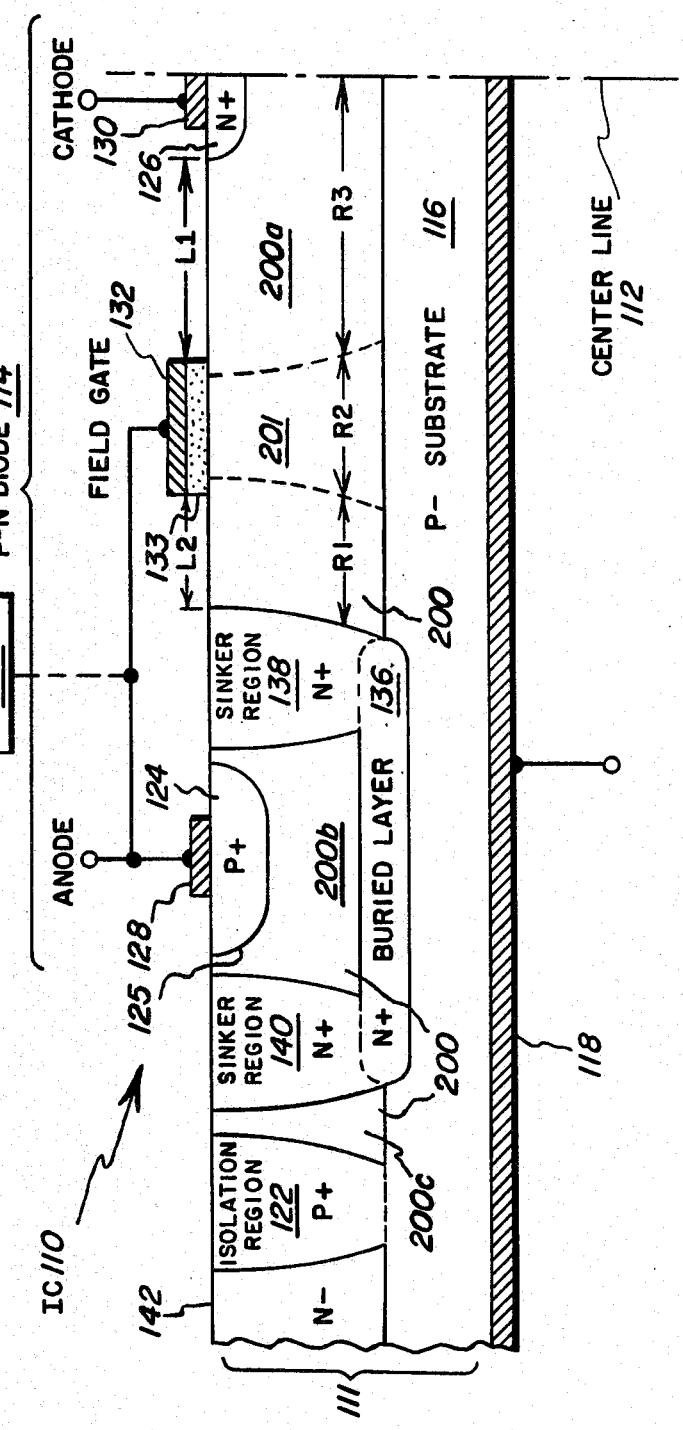
FIG. 2 is a view similar to FIG. 1 of a high voltage semiconductor device incorporating a P-N diode and constructed in accordance with a first embodiment of the present invention.

Referring now to FIG. 2, an integrated circuit 110 is shown wherein features identical to those of FIG. 1 are indicated by like reference numerals incremented by 100. In accordance with a first embodiment of the invention, diode 114 includes a drift layer 200 having portions 200a, 200b and 200c. Layer portion 200a includes a region 201 (shown bounded by dashed lines) underlying field gate electrode 132 and having a charge density Q2 selected to be of lesser magnitude than the charge density Q3 throughout the remainder of N⁻ drift layer 200. In the preferred embodiment of the invention, the charge density Q3 is selected during the device fabrication process by depositing charge carriers into lightly doped, epitaxially grown N⁻ layer 200 through upper surface 142. Charge density Q2 is also selected during the device fabrication process by blocking the area on surface 142 which is to be overlaid by field gate electrode 132, for example, by using a photoresist process, before the deposition of the charge carriers is performed. Such a process would retain the charge density incorporated during the epitaxial growth step of N⁻ layer 200. For a typical 10 micron thick epitaxial layer doped to a carrier concentration of $2 \times 10^{14}$ dopant atoms per cubic centimeter, the resulting intrinsic epitaxial charge density is $0.2 \times 10^{12}$ dopant atoms per square centimeter. FIG. 2 further shows a biasing circuit 204, external to diode 114 (though still possibly situated on wafer 111) to which field gate electrode 132 can be optionally, electrically connected. Circuit 204 can comprise one of many known bias circuit arrangements, for example an anode current-activated driver circuit. Field gate electrode 132 is spaced fron sinker region 138 by a distance L2 and from cathode region 126 by a distance L1.

In operation, due to the decreased charge density in N⁻ layer region 201, the region pinches off at a much lower voltage than the corresponding region of FIG. 1. Experimentation has shown that this lower pinch-off voltage functions to keep buried layer 136 at a potential of less than 25 volts when the device is in a typical reverse blocking mode of operation. This decreased potential of buried layer 136 is well below the avalanche breakdown voltage for bipolar junction 125.

It will be appreciated, however, that decreasing the charge density of region 201 has the undesirable effect of increasing the on-resistance of diode 114. In FIG. 2, the on-resistance of diode 114 comprises substantially the sum of the series resistances indicated at R1, R2 and R3, each of which represents the resistance of a respective region of N⁻ layer portion 200a. When diode 114 is in the forward conducting mode of operation, field gate electrode 132 is at substantially the same potential as N⁻ layer portion 200a. Charge density Q2 in region 201 is thus lower than the charge density Q3 in the remainder of N⁻ layer portion 200a. This lesser charge density Q2 results in the resistive component R2 of region 201 being higher than resistive components R1 and R3. To decrease resistive component R2, and thereby decrease the on-resistance of diode 114, field gate electrode 132 may be optionally connected to biasing circuit 204 during the forward conducting mode of operation. Biasing circuit 204 can be selected, for example, to provide a bias voltage in the range of 10 volts to field gate electrode 132. A bias voltage will create an electrical field in region 201, attracting charge carriers from the adjoining, more highly doped regions of drift layer 200a, to create a high conductivity N-type channel under electrode 132. Such a channel will lower resistive component R2, thus lowering the on-resistance of diode 114.

Figure 3:
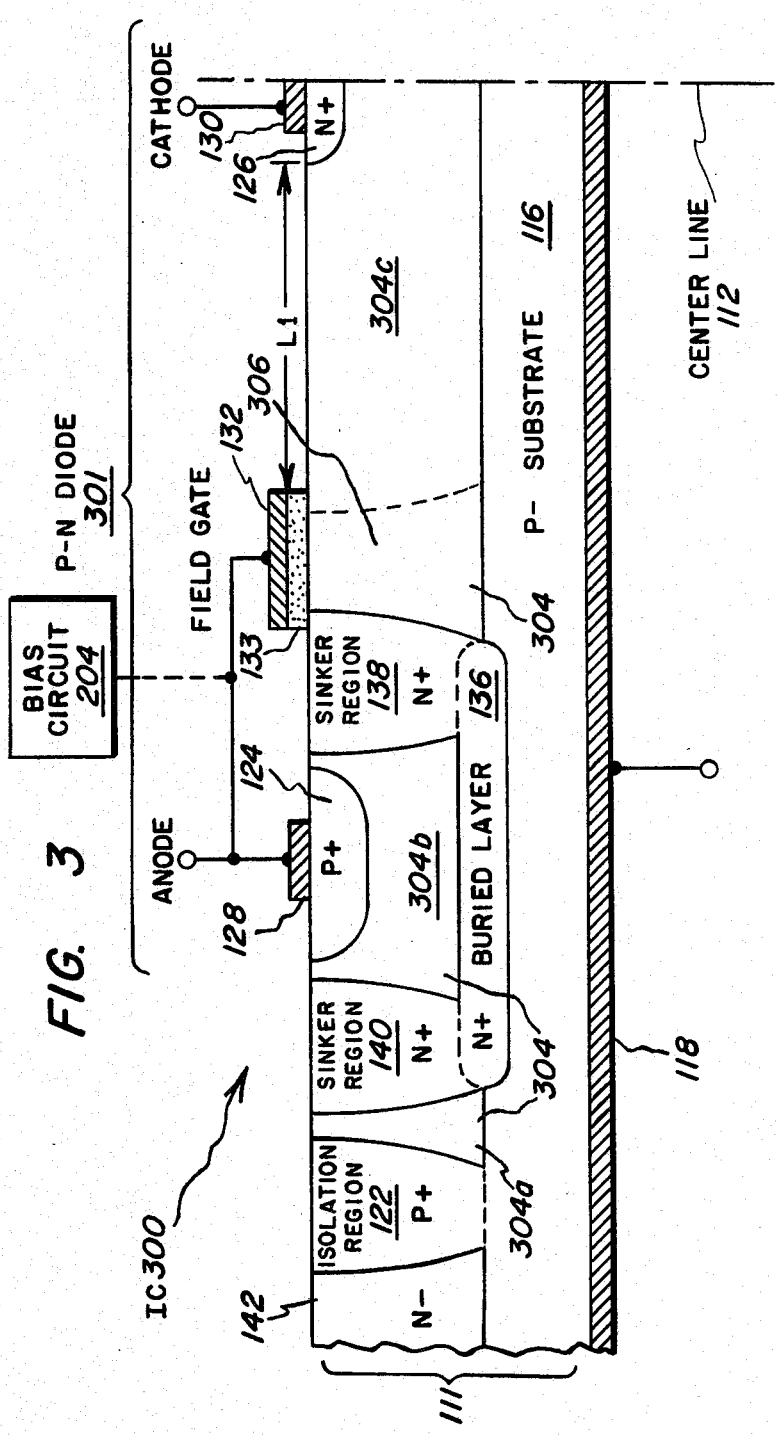
FIG. 3 is a view similar to FIG. 1 of a high voltage semiconductor device incorporating a P-N diode and constructed in accordance with a second embodiment of the present invention.

Referring now to FIG. 3, an integrated circuit 300 is illustrated wherein features identical to those of IC 110 (FIG. 2) are indicated by like reference numerals. In accordance with this alternate embodiment of the invention, a diode 301 includes a N$^-$ drift layer 304 having portions 304a, 304b and 304c. Field gate electrode 132 overlies and is insulatively spaced from both sinker region 138 and a region 306 of N$^-$ layer portion 304c. Region 306 has a relatively light charge density, selected in the manner described for region 201 (FIG. 2) above. Since, in the reverse blocking mode of operation, the majority of the blocked potential is dropped over the distance L1, with field gate electrode 132 positioned to overlap sinker region 138, the distance between sinker region 138 and cathode region 126 can be decreased by the distance L2 (FIG. 2). This decrease in distance not only produces smaller, more compact diode 301, but is also reduces the resistive component R1 (FIG. 2) of the on-resistance to virtually 0, decreasing the total device on-resistance. Thus, when field gate electrode 132 is biased at a positive potential by biasing circuit 204, the on-resistance of diode 301 in the forward conducting mode of operation is reduced below even that of diode 114 (FIG. 2).

Figure 4:
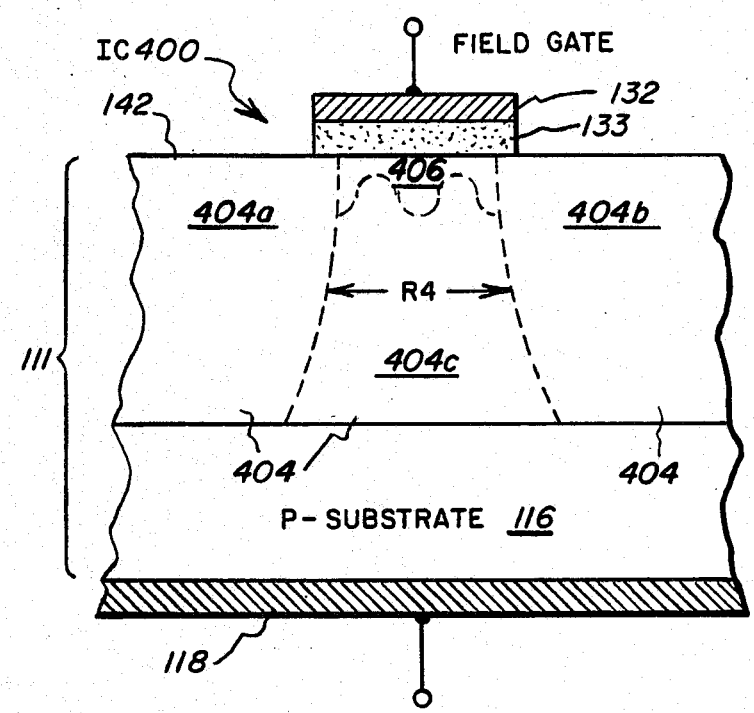
FIG. 4 is a cross-sectional schematic view of a field gate electrode and underlying drift region of a high voltage semiconductor device constructed in accordance with a third embodiment of the present invention, the view being enlarged to better illustrate details.

FIG. 4 shows a portion of an IC 400 enlarged about gate electrode 132 to better illustrate details of another alternate embodiment of the invention. Features identical to those of FIG. 2 are indicated by like reference numerals. As shown, wafer 111 includes a N$^-$ drift layer 404 having portions 404a, 404b and 404c. In accordance with this embodiment of the invention, drift layer portions 404a and 404b are fabricated to have a uniform charge density, while a region 406 of N$^-$ layer portion 404c, underlying field gate electrode 132, is patterned to provide a lower effective charge density of varying magnitude. Such varying charge density can be achieved, for example, by patterning surface 142 of drift region 404 before depositing charge carrier therein in the manner described above. This patterning can be performed, for example, by the use of a photo resist process. N$^-$ layer portion 404c thus has a resulting charge density greater than region 201 of FIG. 2, but less than that of N$^-$ layer portions 404a and 404c.

In operation, due to the relatively higher charge density of N$^-$ layer portion 404c in comparison to the corresponding regions 201 and 306 (FIGS. 2 and 3, respectively), the resistive component R4 of the region is lower than the resistive components of the corresponding regions. External biasing of field gate electrode 132 during the forward conducting mode of operation will function to even further reduce resistive component R4. Further, since N$^-$ layer portion 404c still has a lower charge density than N$^-$ layer portions 404a and 404b, region 404c exhibits the desirable, low pinch-off voltage which is an object of the present invention. It has been determined that the optimum tradeoff between maintaining a low device on-resistance and a low pinch-off voltage is achieved when the effective charge density of the drift region portion underlying a field gate (drift region portion 404c of FIG. 4) is selected to be between 10% and 90% of the effective charge density of the remainder of the drift region. It will be appreciated by those skilled in the art that this patterning of the charge density underlying the field gate electrode can be used with either of the embodiments of the invention shown in FIGS. 2 or 3 or, as will become apparent, with those embodiments shown and described below in FIGS. 5 and 6.

Figure 5:
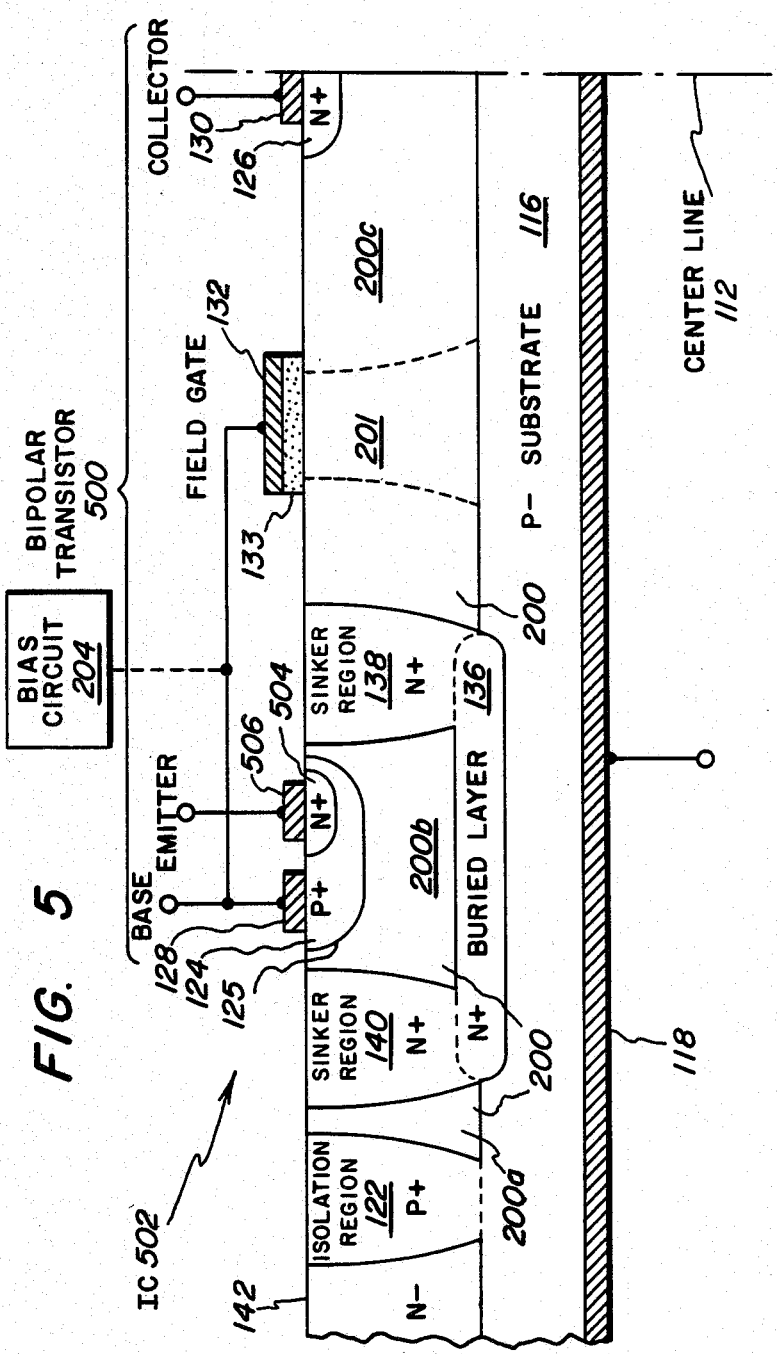
FIG. 5 is a view similar to FIG. 1 of a high voltage semiconductor device incorporating a bipolar transistor and constructed in accordance with the first embodiment of the invention.

The concepts of the present invention may be embodied in semiconductor devices other than the P-N diodes shown in FIGS. 2 and 3. FIG. 5 shows another embodiment of the invention including a bipolar transistor 500 incorporated laterally into an IC 502. Features identical to those of FIG. 2 retain like reference numerals. In particular, N$^+$ collector region 126 of bipolar transistor 500 corresponds to N$^+$ cathode region 126 of diode 114, and P$^+$ base region 124 of the transistor corresponds to P$^+$ anode region 124 of the diode. Bipolar transistor 500 further includes an N$^+$ emitter region 504, configured as a loop, adjoining base region 124 and surrounding N$^+$ collector region 126. Base and emitter electrodes 128 and 506, respectively, adjoin base and emitter regions 124 and 504, respectively.

In operation, the function of field gate electrode 132 in IC 502 is essentially the same as described hereinabove. That is, with bipolar transistor 500 in a forward conduction mode and having base, emitter, and collector regions 124, 504 and 126, respectively, each at high voltage (about +500 volts, for example), field gate 132 will not significantly interact with N$^-$ layer portion 200c. In this mode, it may be desirable to connect field gate electrode 132 to bias circuit 204 to reduce the device on-resistance. However, in for example an active mode of operation, collector region 126 may be at +500 volts and base region 124 at +50 volts. In this active mode, field gate electrode 132 functions to pinch off region 201 of N$^-$ layer portion 200c. The pinched off condition of region 201 prevents buried layer 136 (and sinker regions 138 and 140) from rising to a sufficiently high voltage so as to cause an avalanche breakdown of P-N junction 125. Thus, is is seen that the present invention can be beneficially applied in high voltage pull-up devices of the type incorporating bipolar transistors.

Figure 6:
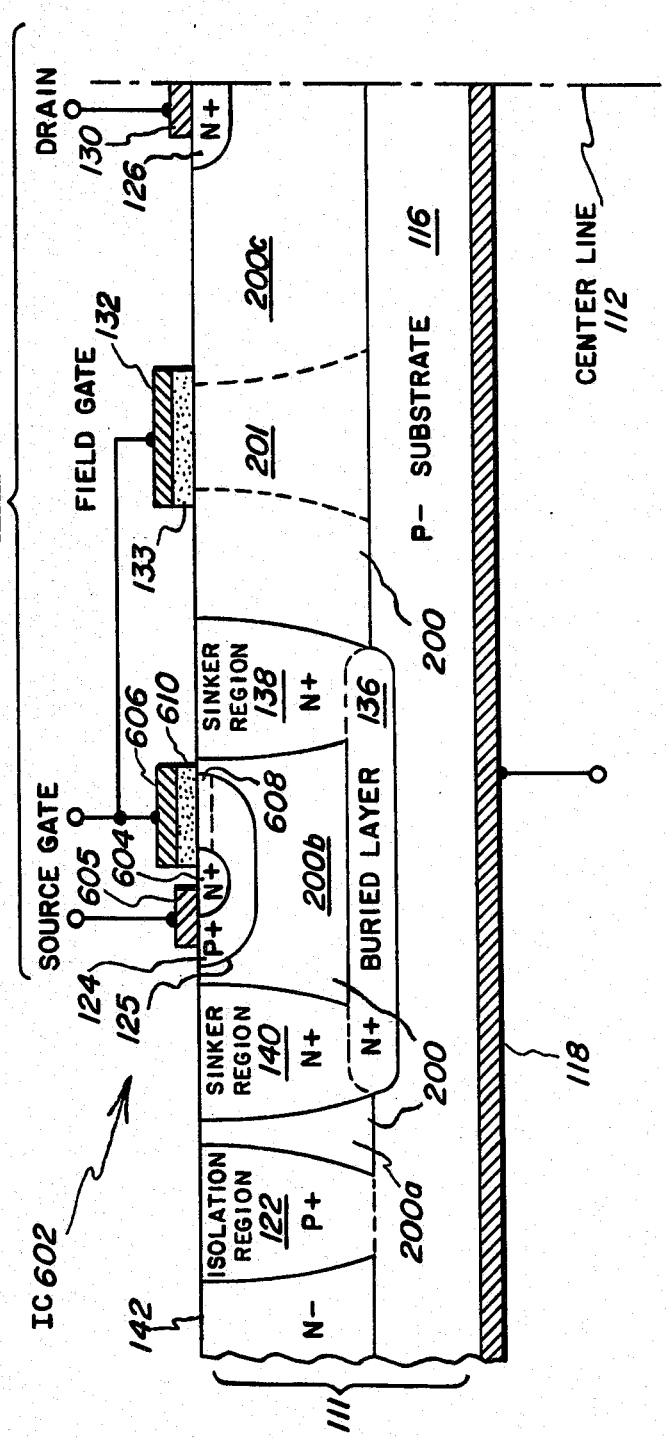
FIG. 6 is a view similar to FIG. 1 of a high voltage semiconductor device incorporating an insulated-gate field-effect transistor and constructed in accordance with the first embodiment of the invention.

A further semiconductor device constructed in accordance with the invention is illustrated in FIG. 6 and includes an IC 602 having a laterally incorporated, insulated-gate field-effect transistor (IGFET) 600. Like reference numerals as between FIGS. 2 and 6 refer to like features. In particular, N$^+$ drain region 126 of IC 602 corresponds to N$^+$ cathode region 126 of FIG. 2, and P$^+$ well region 124 of IC 602 corresponds to P$^+$ anode region 124 of FIG. 2. An N$^+$ source region 604 adjoins P$^+$ well region 124 and is configured as a loop surrounding drain region 126. A source electrode 605 adjoins N$^+$ source region 604 and P well region 124, as is typical in an IGFET. A gate electrode 606 is insulatingly spaced from a portion 608 of P well region 124 by an insulative layer 610 and extends from N$^+$ source region 604 to N$^-$ layer portion 200b.

In operation, to initiate forward conduction of IGFET 600, gate electrode 606 is biased at a sufficiently high positive voltage above that of P well region 124 to cause the formation of an electron inversion layer or channel in P well portion 608. This electron inversion layer is conductive to electrons so as to electrically interconnect N$^+$ source region 604 and N$^-$ layer portion 200b. With source and drain regions 604 and 126, respectively, each at high voltage (for example at about +500 volts), field gate 132 does not significantly influence N$^-$ layer portion 200a. Forward conduction of IGFET 600 then occurs when gate electrode 606 is biased so as to cause electrons originating at source region 604 to flow through the electron inversion layer in P well portion 608 and thence to drain region 126.

With IGFET 600 in a reverse blocking mode of operation, buried layer 136 and sinker regions 138 and 140, tend to rise in voltage by yielding electrons to the higher potential N+ drain region 126. By decreasing the magnitude of the charge density of region 201, in accordance with the present invention, field gate 132 effects pinch-off of region 201, and the buried layer and sinker regions are limited in their voltage rise to a potential safely below the avalanche breakdown voltage of P-N junction 125. It will be appreciated by those skilled in the art that, in the forward conducting mode of operation, gate electrode 606 is at a positive potential with respect to drift layer portion 200c. Thus, with field gate 132 electrically connected to gate electrode 606 in the forward conducting mode of operation, an appropriate bias voltage is applied by gate electrode 606 to field gate 132 for reducing the resistive component of drift layer region 201. Thus, in this embodiment of the invention, no external bias circuit is necessary to reduce the resistive component of region 201, and hence the on-resistance of IGFET 600, to an acceptable value.

The foregoing describes high voltage semiconductor devices that exhibit a low pinch-off voltage of an inherent MOSFET, thus providing high operational reliability over a long lifespan. These devices further provide the beneficial feature of a very low on-resistance. Finally, integrated circuit devices constructed in accordance with the present invention can advantageously be fabricated using conventional semiconductor device technology.

While this invention has been described with respect to specific embodiments, many modifications and substitutions will be apparent to those skilled in the art. For example, complementary integrated circuit devices could be fabricated, in which P-conductivity type material is used in lieu of N-conductivity type material, and vice-versa. It is, therefore, to be understood that the appended claims are intended to cover these and all such modifications and substitutions as fall within the true spirit and scope of the invention.

What is claimed as the invention and desired to be secured by Letters Patent of the United States is:

1. In an integrated circuit of the type including a substrate layer of a first conductivity type, a drift layer of an opposite conductivity type having a selected first charge density and overlying said substrate layer, and an isolation region of said first conductivity type adjoining said substrate and surrounding said drift layer, a semiconductor device comprising:

a first main device region of said opposite conductivity type extending into an upper portion of said drift layer;

a second main device region of said first conductivity type extending into an upper portion of said drift layer and configured as a loop surrounding said first main device region;

a highly-doped buried layer of said opposite conductivity type situated between said substrate and drift layers, beneath said second main device region and configured as a loop surrounding said first main device region;

a highly-doped first sinker region of said opposite conductivity type extending from an upper surface of said drift layer to said buried layer, said sinker region being configured as a loop surrounding said first main device region;

a highly-doped second sinker region of said opposite conductivity type extending from said upper surface of said drift layer to said buried layer, said second sinker region being configured as a loop surrounding said first and second main device regions;

a field gate electrode insulatingly spaced from said drift layer, situated between said first sinker region and said first main device region, and configured as a loop surrounding said first main device region; and a portion of said drift region underlying said field gate electrode having a selected second charge density of lesser magnitude than said first charge density.

2. A semiconductor device according to claim 1 wherein:

said first charge density is selected by depositing charge carriers of said opposite conductivity type into said drift layer; and said second charge density is selected by patterning the deposition of said charge carriers into said portion of said drift region underlying said field gate electrode.

3. A semiconductor device according to claim 2 wherein said second charge density is selected by prohibiting the deposition of said charge carriers into said portion of said drift region underlying said field gate electrode.

4. A semiconductor device according to claim 1 wherein said first and second main device regions comprise cathode and anode regions of a P-N diode, respectively.

5. A semiconductor device according to claim 4 wherein said field gate electrode is electrically shorted to said anode region.

6. A semiconductor device according to claim 4 wherein said field gate electrode is selectively biased by an active circuit disposed externally to said semiconductor device.

7. A semiconductor device according to claim 1 wherein said first and second main device regions comprise collector and base regions of a bipolar transistor, respectively, said device further comprising an emitter region of said opposite conductivity type formed within said base region and configured as a loop surrounding said collector region.

8. A semiconductor device according to claim 7 wherein said field gate electrode is electrically shorted to said base region.

9. A semiconductor device according to claim 7 wherein said field gate electrode is selectively biased by an active circuit disposed externally to said semiconductor device.

10. A semiconductor device according to claim 1 wherein said first and second main device regions comprise drain and well regions of an insulated-gate field-effect transistor, respectively, said device further comprising a source region of said opposite conductivity type formed within said well region and configured as a loop surrounding said drain region, and a gate electrode insulatingly spaced from said well region.

11. A semiconductor device according to claim 10 wherein said field gate electrode is electrically shorted to said gate electrode.

12. A semiconductor device according to claim 1 wherein said substrate comprises P-conductivity type semiconductor material and said drift layer comprises N-conductivity type semiconductor material.

13. A semiconductor device according to claim 12 wherein said substrate and drift layers each comprise silicon semiconductor material.

14. A semiconductor device according to claim 13 wherein said second charge density is selected to be in the range of from 10% to 90% of the value of said first charge density.

15. In an integrated circuit of the type including a substrate layer of a first conductivity type, a drift layer of an opposite conductivity type having a selected first charge density and overlying said substrate layer, and an isolation region of said first conductivity type adjoining said subtrate and surrounding said drift layer, a semiconductor device comprising:

a first main device region of said opposite conductivity type extending into an upper portion of said drift layer;

a second main device region of said first conductivity type extending into an upper portion of said drift layer and configured as a loop surrounding said first main device region;

a highly-doped buried layer of said opposite conductivity type situated between said substrate and drift layers, beneath said second main device region and configured as a loop surrounding said first main device region;

a highly-doped first sinker region of the opposite conductivity type extending from an upper surface of said drift layer to said buried layer, said first sinker region being configured as a loop surrounding said first main device region;

a highly-doped second sinker region of said opposite conductivity type extending from an upper surface of said drift layer to said buried layer, said second sinker region being configured as a loop surrounding said first and second main device regions;

a field gate electrode insulatingly spaced from both said drift layer and said first sinker region, situated between said first and second main device regions, and configured as a loop surrounding said first main device region; and a portion of said drift region underlying said field gate electrode and adjoining said first sinker region having a selected second charge density of lesser magnitude than said first charge density.

16. A semiconductor device according to claim 15 wherein:

said first charge density is selected by depositing charge carriers of said opposite conductivity type into said drift layer; and said second charge density is selected by patterning the deposition of said charge carriers into said portion of said drift region having said second charge density.

17. A semiconductor device according to claim 16 wherein said second charge density is selected by prohibiting the deposition of said charge carriers into said portion of said drift region having said second degree density.

18. A semiconductor device according to claim 15 wherein said first and second main device regions comprise cathode and anode regions of a P-N diode, respectively.

19. A semiconductor device according to claim 18 wherein said field gate electrode is electrically shorted to said anode region.

20. A semiconductor device according to claim 18 wherein said field gate electrode is selectively biased by an active circuit disposed externally to said semiconductor device.

21. A semiconductor device according to claim 15 wherein said first and second main device regions comprise collector and base regions of a bipolar transistor, respectively, said device further comprising an emitter region of said opposite conductivity type formed within said base region and configured as a loop surrounding said collector region.

22. A semiconductor device according to claim 21 wherein said field gate electrode is electrically shorted to said base region.

23. A semiconductor device according to claim 21 wherein said field gate electrode is selectively biased by an active circuit disposed externally to said semiconductor device.

24. A semiconductor device according to claim 15 wherein said first and second main device regions comprise drain and well regions of an insulated-gate field-effect transistor, respectively, said device further comprising a source region of said opposite conductivity type formed within said well region and configured as a loop surrounding said drain region, and a gate electrode insulatingly spaced from said well region.

25. A semiconductor device according to claim 24 wherein said field gate electrode is electrically shorted to said gate electrode.

26. A semiconductor device according to claim 15 wherein said substrate comprises P-conductivity type semiconductor material and said drift layer comprises N-conductivity type semiconductor material.

27. A semiconductor device according to claim 26 wherein said substrate and drift layers each comprises silicon semiconductor material.

28. A semiconductor device according to claim 27 wherein said second charge density is selected to be in the range of from 10% to 90% of the value of said first charge density.

* * * * *